US007319281B2

(12) United States Patent
Yampolsky

(10) Patent No.: US 7,319,281 B2
(45) Date of Patent: Jan. 15, 2008

(54) MULTI-STAGE BLUMLEIN

(75) Inventor: Joseph Yampolsky, Torrance, CA (US)

(73) Assignee: Sparktronics, Inc., Torrance, CA (US)

( * ) Notice: Subject to any disclaimer, the term of this patent is extended or adjusted under 35 U.S.C. 154(b) by 522 days.

(21) Appl. No.: 11/043,681

(22) Filed: Jan. 26, 2005

(65) Prior Publication Data

US 2005/0174715 A1 Aug. 11, 2005

Related U.S. Application Data

(60) Provisional application No. 60/539,493, filed on Jan. 27, 2004.

(51) Int. Cl.
*H03K 3/00* (2006.01)
(52) U.S. Cl. ...................................... 307/106
(58) Field of Classification Search ................. 307/106
See application file for complete search history.

(56) References Cited

U.S. PATENT DOCUMENTS 5,138,270 A * 8/1992 Nakata et al. ............... 327/179
2001/0054947 A1* 12/2001 Buckles et al. ............. 336/212

* cited by examiner

*Primary Examiner*—Robert L. DeBeradinis
(74) *Attorney, Agent, or Firm*—Knobbe, Martens, Olson & Bear, LLP

(57) ABSTRACT

A high-voltage pulse generator to generate short high-voltage pulses is described. In one embodiment, a multi-stage Blumlein is used to form relatively short relatively high-voltage pulses. In one embodiment, the multi-stage Blumlein is based on transmissions lines and provides short pulses to a desired load. In one embodiment, repetition rates on the order of 1 kHz-5 kHz are be achieved due to relatively small charging time and relatively small charging inductances. In one embodiment, water as a capacitor dielectric provides a working field strength of 150-200 kv/cm. In one embodiment, the multi-stage Blumlein is used to provide short pulses for a cold cathode as a source of electrons.

18 Claims, 4 Drawing Sheets

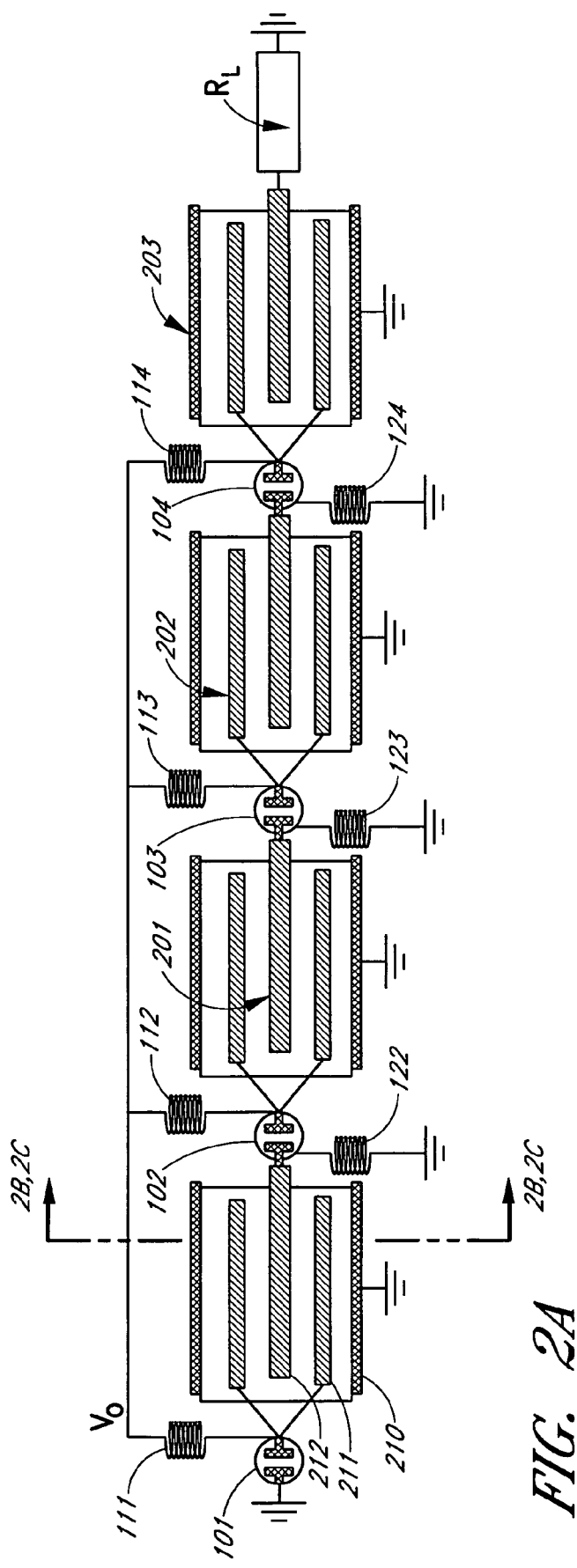
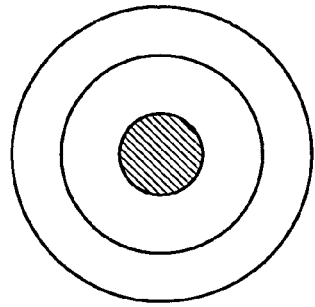
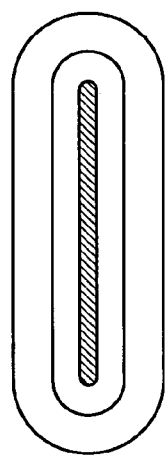
FIG. 2A
FIG. 2B
FIG. 2C

MULTI-STAGE BLUMLEIN

REFERENCE TO RELATED APPLICATIONS

The present application claims priority benefit of U.S. Provisional Application No. 60/539,493 filed Jan. 27, 2004, titled "MULTI-STAGE BLUMLEIN", the entire contents of which is hereby incorporated by reference.

BACKGROUND OF THE INVENTION

1. Field of the Invention

The invention relates to high-voltage pulse generators using multiple transmission line stages.

2. Description of the Related Art

A Marx generator is often used to provide high-voltage pulses of several megavolts. However, the Marx generator cannot supply short high-voltage pulses on the order of tens of nanosecond in the megavolt range. The intrinsic inductance of the Marx generator does not allow such performance.

SUMMARY

These and other problems are solved by providing a high-voltage pulse generator to generate short high-voltage pulses. In one embodiment, a multi-stage Blumlein is used to form short high-voltage pulses. In one embodiment, the multi-stage Blumlein is based on transmission lines and provides extremely short pulses of the order of 30-50 ns to a load of 20-50 Ohms. In one embodiment, repetition rates of order of 1 kHz-5 kHz can be achieved due to small charging time and small charging inductances. In one embodiment, water as a capacitor dielectric to provide a working the field strength of 150-200 kv/cm. In one embodiment, the multi-stage Blumlein is used to provide short pulses for a cold cathode as a source of electrons.

One embodiment includes a plurality of axial Blumleins, each Blumlein having an outer electrode, an intermediate electrode, and an inner electrode. The intermediate electrode of the first Blumlein is provided to ground via a first switch and the inner electrode on the distal end of the first Blumlein is provided via a second switch to the intermediate electrode of the second Blumlein, from inner electrode of the second Blumlein via a third switch to the intermediate electrode of a third Blumlein. The inner electrode of the third Blumlein is connected to a load. In one embodiment, the intermediate electrodes are coupled to a power supply via inductors and to the ground via inductors. Although described in terms of three Blumleins, one of ordinary skill in the art will recognize that the additional Blumlein sections can be added.

One embodiment includes a plurality of axial Blumleins each having an outer electrode, an intermediate electrode, and an inner electrode. The intermediate electrode of the first Blumlein is provided to a ground via a first switch and the inner electrode of the first Blumlein is provided via a second switch to the intermediate electrode of the second Blumlein. The inner electrode of the second Blumlein is provided to a load.

One embodiment includes a plurality of Blumleins each having an input electrode and an output electrode. The plurality of Blumleins are connected in series such that an output electrode of each Blumlein is provided through a switch to an input of a subsequent Blumlein, where the input electrode of the first Blumlein is provided to ground through a switch, and the output of the last Blumlein in the series is provided to a load.

In one embodiment, each of the Blumleins is provided to a charging power supply through supply charging inductors and to ground through supply grounding inductors. In one embodiment, the supply charging and ground inductors have sufficient inductance to represent a relatively high impedance to the frequencies of the pulses generated by the pulse generator. In one embodiment, the supply charging and ground inductors have a sufficiently low inductance to allow the Blumleins to be substantially recharged between pulses.

BRIEF DESCRIPTION OF THE DRAWINGS

FIG. 2A shows one implementation of the multi-stage Blumlein circuit of FIG. 1.

FIG. 2B shows a concentric coaxial transmission line having an oval cross section.

FIG. 2C shows a concentric coaxial transmission line having a circular cross section

DETAILED DESCRIPTION

Figure 1:
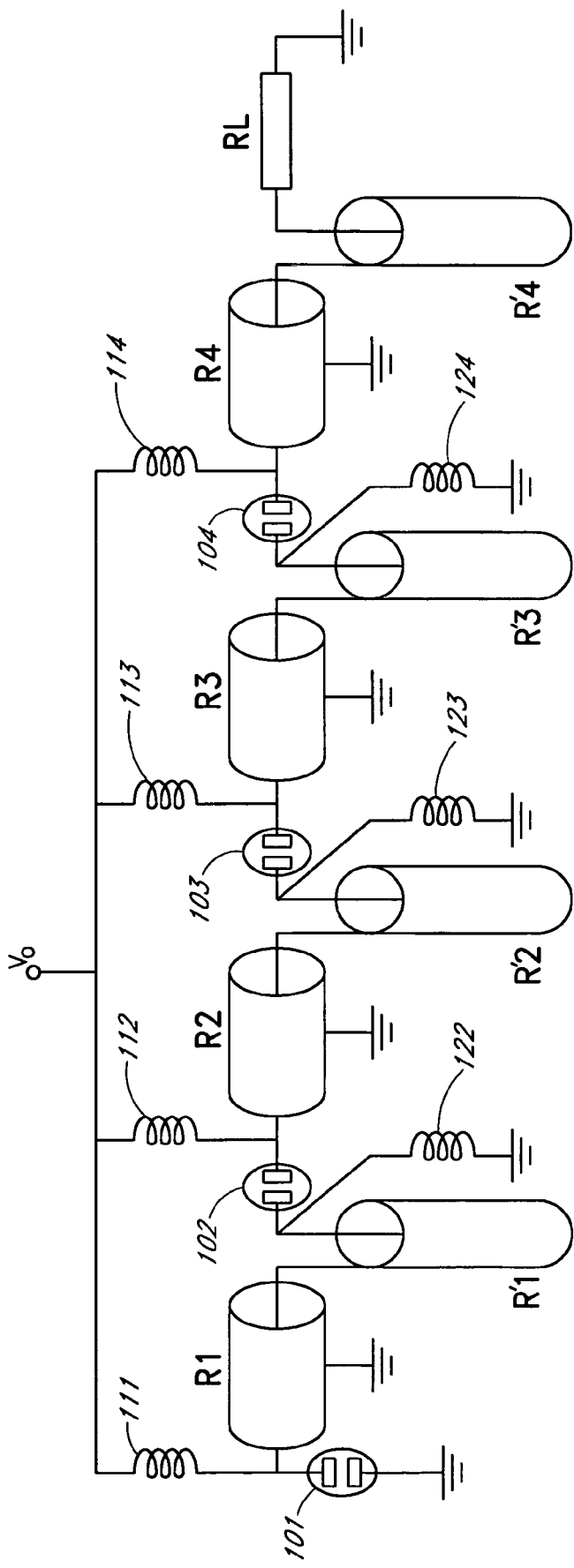
FIG. 1 shows a multi-stage switched Blumlein. Wherein a first Blumlein configured from two transmission lines R1 and R'1 is provided through a spark gap to a second Blumlein configured from two transmission lines R2 and R'2.

FIG. 1 shows a multi-stage switched Blumlein. In FIG. 1, a first Blumlein configured from two transmission lines R1 and R'1 is provided through a spark gap 102 to a second Blumlein configured from two transmission lines R2 and R'2. The input of the transmission line R1 is provided to ground through a spark gap 101. The second Blumlein configured from two transmission lines R2 and R'2 is provide through a spark gap 103 to a third Blumlein configured from two transmission lines R3 and R'3. The third Blumlein configured from two transmission lines R3 and R'3 is provide through a spark gap 104 to a fourth Blumlein configured from two transmission lines R4 and R'4. The fourth Blumlein is provided to a grounded load RL. The transmission lines R'1, R'2, R'3, and R'4 are charged by an external power supply through inductors 111-114 and 122-124. A first terminal of the inductor 111 is provided to the ungrounded side of the spark gap 101. A second terminal of the inductor 111 is provided to V0 (the external power supply). A first terminal of the inductor 112 is provided to the R2 side of the spark gap 102. A second terminal of the inductor 112 is provided to V0. A first terminal of the inductor 113 is provided to the R3 side of the spark gap 103. A second terminal of the inductor 113 is provided to V0. A first terminal of the inductor 114 is provided to the R4 side of the spark gap 104. A second terminal of the inductor 114 is provided to V0. The R'1 side of the spark gap 102 is provided to ground through the inductor 122. The R'2 side of the spark gap 103 is provided to ground through the inductor 123. The R'3 side of the spark gap 104 is provided to ground through the inductor 124. FIG. 1 shows four Blumleins by way of example and not by way of limitation. The number of Blumleins can be less than four or greater than four.

When R1=R'1 are charged by the charging voltage, the output wave of the first Blumlein goes into the spark gap 101 in series with the charged line R2 having an impedance R2. If the spark gap 101 is designed for a voltage V0, then the over-voltage at this gap will be equal to 3 (2*V0 from the left and −V0 from the right.) The spark gap will be switched on very quickly (e.g., on the order of several nanoseconds or less). Thus, the spark gap acts as a switch. One of ordinary skill in the art will recognize that the spark gap switch can be replaced by other switches such, as, for example, solid-state switches, a tube-based switches, combinations of solid-state and tube switches, etc. When the spark gap 101 is on, the first Blumlein and the second Blumlein are connected as a line with impedance 2×R1 on the left and a line of impedance R2 on the right. The right line is charged up to the voltage V0. The spark gaps 102 and 103 operate in a similar fashion between the second-third and third-fourth Blumleins respectively. The inductance of the inductors 111-114 and 112-124 tends to isolate the multistage Blumlein from the charging circuit during the relatively short discharge period.

FIG. 2A shows one implementation of the multi-stage Blumlein circuit of FIG. 1. In FIG. 2A, the transmission line sections R1 and R'1 are arranged as concentric coaxial transmission lines, such that the outer conductor of the section R'1 serves as the inner conductor for the section R1. Similarly, the transmission line sections R2/R'2, R3/R'3, and R4/R'4 are arranged as concentric coaxial transmission line respectively. For example, the inner conductor of the transmission line section R'1 is shown as a conductor 212. The outer conductor of the transmission line section R1 is shown as a conductor 210. A conductor 211 serves as the inner conductor of the transmission line section R1 and as the outer conductor of the transmission line section R'1.

In one embodiment, one or more of the concentric coaxial transmission lines have an oval cross section (as shown in FIG. 2B), a circular cross section (as shown in FIG. 2C), an elliptical cross section, etc.

In terms of falling waves and reflected waves on the Blumleins, the following equations can be written:

$$V1r=(2\times V2f\times R1+V1f\times (R1-R2))/(R1+R2)$$

$$V2r=(2\times V1f\times R2+V2f\times (R2-R1))/(R2+R1)$$

where $V1r$ is a reflected wave in the first line, $V2r$ is a reflected wave in the second line, $V1f$ is a falling wave in the first line and $V2f$ is a falling wave in the second line. The reflected waves are reflected from the joint of two lines. The falling waves fall to the joint of the two lines.

In order to match two lines, the reflection in the first line can be eliminated. It means that the voltage $V1r$ is reduced to zero or close to zero. When the line is electrostaticly charged, the wave $V2r=V2f=V0/2$. At the output of the first Blumlein $V1f=V0$. Inserting this data in the Eq. 1 we can find that the impedance R2 equals R2=4×R1. In the ordinary Blumlein R2=2×R1. The difference occurs because the second line is charged.

A computer program (e.g., programmed in BASIC) can be used to computer the falling and reflected waves for a number of consecutive Blumleins. Using such a program, the impedances of up to 10 Blumleins are shown in Table 1 (where the waves moving from the load end to the beginning are eliminated). As shown in Table 1, can see the impedances.

TABLE 1

| Number of Blumleins -N | Ratio of RN to R1 | Ratio of R'N to R1 = R'1 | Falling Wave VN/V0 | Over voltage at switch |
|---|---|---|---|---|
| 1 | 1 | 1 | 1 | 3 |
| 2 | 4 | 1.333 | 2 | 5 |
| 3 | 8 | 1.6 | 3 | 7 |
| 4 | 12.8 | 1.828 | 4 | 9 |
| 5 | 18.28 | 2.03 | 5 | 11 |
| 6 | 24.37 | 2.21 | 6 | 13 |
| 7 | 31 | 2.38 | 7 | 15 |
| 8 | 38.15 | 2.54 | 8 | 17 |
| 9 | 45.78 | 2.69 | 9 | 19 |
| 10 | 53.85 | 2.83 | 10 | 21 |

Figure 3:
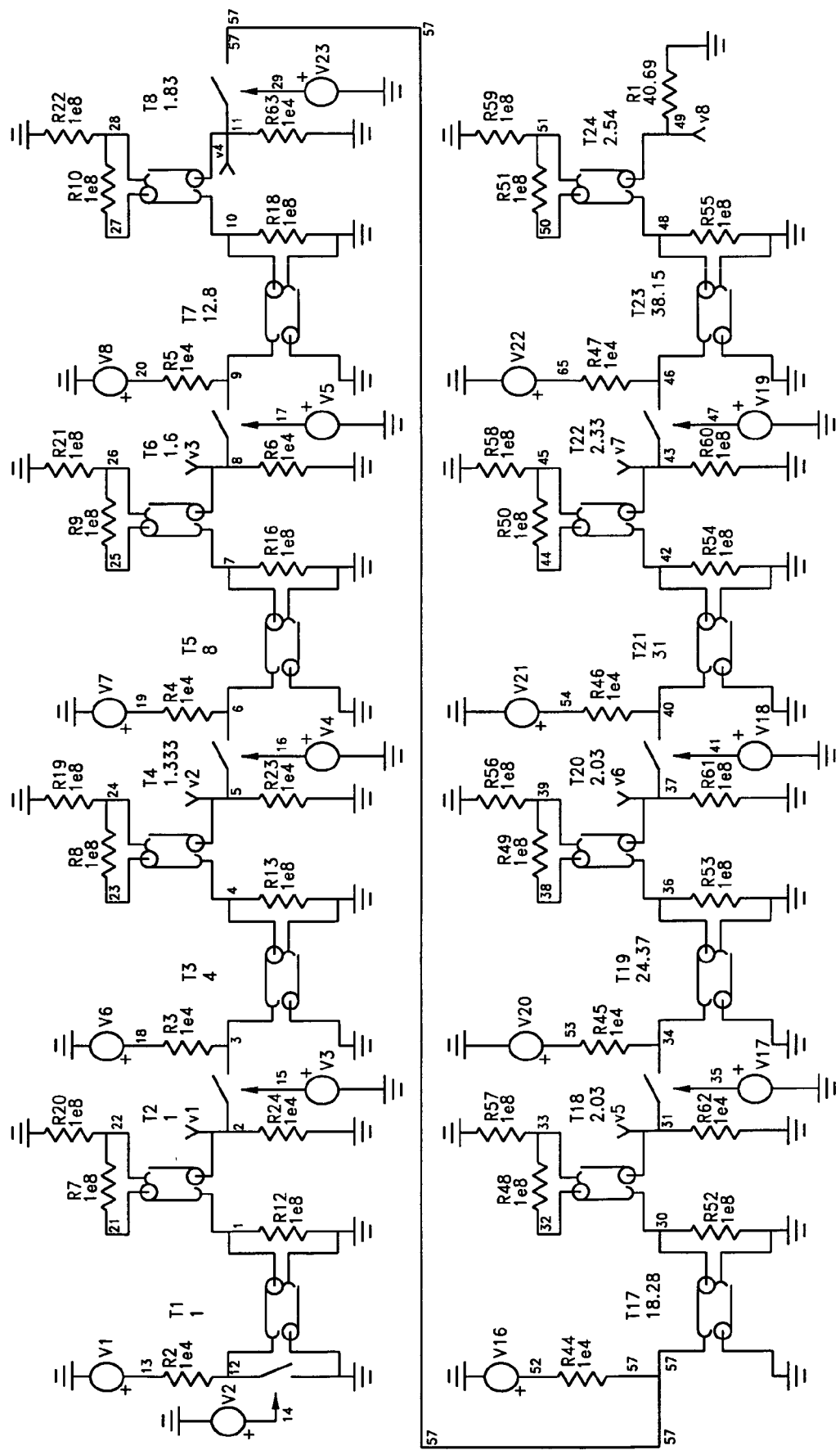
FIG. 3 shows one embodiment of a SPICE circuit used for modeling the multi-stage Blumlein.

A standard SPICE program—ICAP4 can be used to verify the results listed in Table 1. FIG. 3 shows the SPICE circuit used for this verification. The spark gaps were modeled with a linear switch where R off=1e10 and Ron=0.001 Ohm (ideal condition). The inductance of the switch is chosen equal to zero. The switches are switched on at the moment when the wave reaches the switch. In this ideal condition, it is useful to follow up the reflected waves to prove that they are close to zero to verify the above written theory. The charging voltage of the line were choose to be equal to 60 v.

Figure 4:
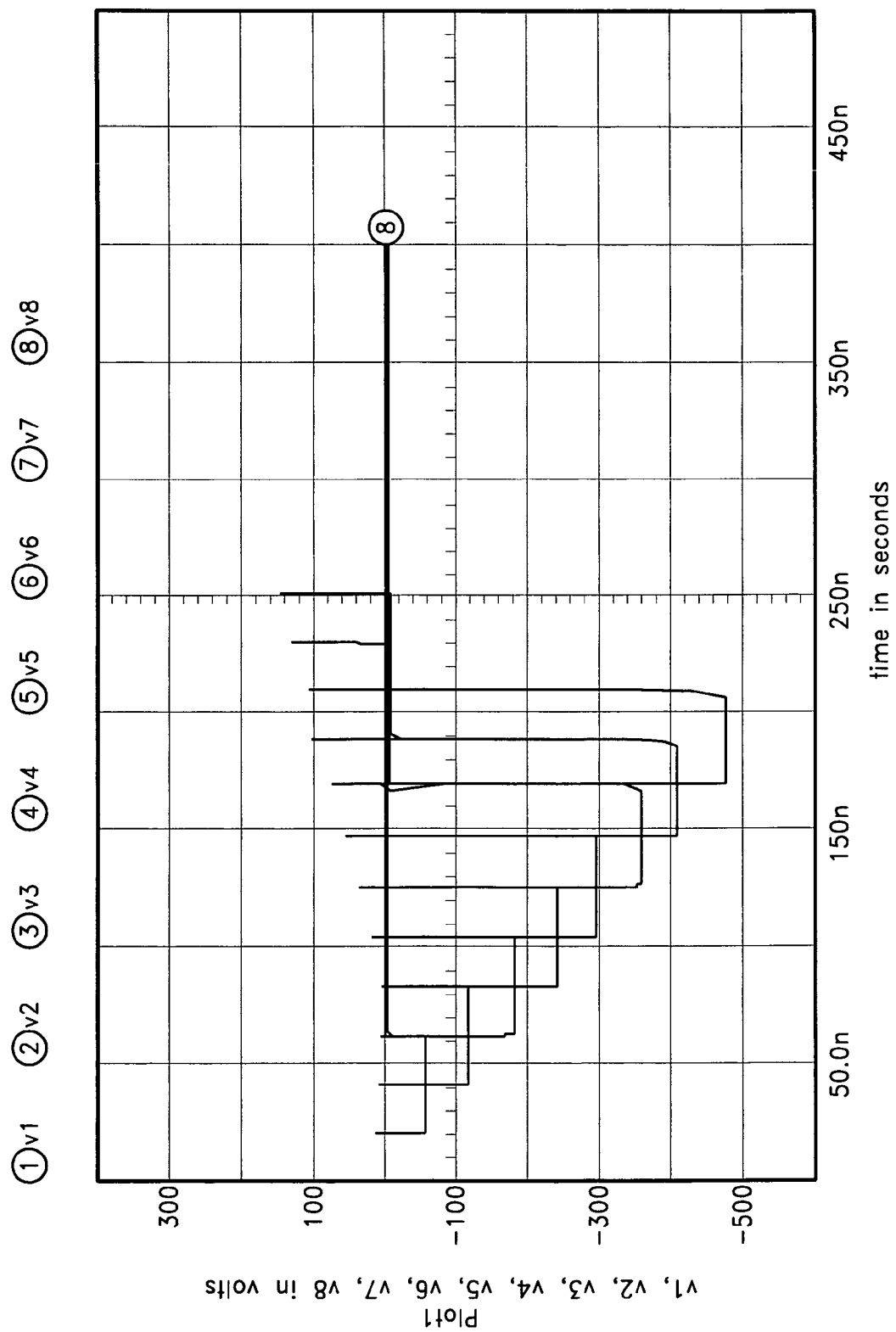
FIG. 4 shows the voltage at different outputs of the Blumleins.

FIG. 4 shows the voltage at different outputs of the lines: from 1 to 8. From FIG. 4 one can see several things. The output voltage is equal to 478V, corresponding to an efficiency of 98% (2% is lost due to the program calculations. Secondly, there is no reflection more than 3% (reflected power 0.1%). The spikes are about 30% but they do not have appreciable energy. Since these spikes are short, they show that the calculations are idealized.

The large over-voltage obtained in this scheme shows that there is a good ground to achieve very short pulses. This scheme is similar to Marx generator in terms of over voltage but it is free of parasitic capacitance and inductance.

The energy carrying lines decrease their capacitance of about 3 times when the number of stages reaches 10. This means that this scheme is good for high voltage but not good enough for high energy. The capacitance of the energy carrying lines can be fixed at some level and can be kept at the fixed level to the load. In this case, the impedances can be transmitting lines will be different from those shown in Table 1. The impedances can be selected to obtain relatively high efficiency. In Table 2 the impedance of such lines is shown. One can see that even 12 consecutive structures can provided 92% of thoretical efficiency. The practical losses in the multi-stages line is about 50%.

In one embodiment, the multi-stage Blumlein is used as an injector for a linacs. If the arrangement of changing impedance is good at the beginning of the multi-stage Blumlein, then the rest of the arrangement becomes less important.

TABLE 2

| Number of Blumlein Stages | Ratio of Rn to R1 | Ratio of R'n to R1 | Efficiency % |
|---|---|---|---|
| 1 | 1 | 1 | 98 |
| 2 | 4 | 1.33 | 98 |
| 3 | 8 | 1.6 | 98 |
| 4 | 12.2 | 1.6 | 97.6 |
| 5 | 16.4 | 1.6 | 97.2 |

TABLE 2-continued

| Number of Blumlein Stages | Ratio of Rn to R1 | Ratio of R'n to R'1 | Efficiency % |
|---|---|---|---|
| 6 | 20.6 | 1.6 | 97 |
| 7 | 24.8 | 1.6 | 96.1 |
| 8 | 29 | 1.6 | 95.4 |
| 9 | 33.2 | 1.6 | 94.6 |
| 10 | 37.4 | 1.6 | 93.8 |
| 11 | 41.6 | 1.6 | 93 |
| 12 | 45.8 | 1.6 | 92 |

There are other possible consecutive numbers that provide good performance of the multi-stage Blumlein. Tables 1 and 2 show that this scheme can give good results.

The lines R1, R2, R3, etc. are grounded and they are working well with no problem. However, the lines R1', R2' and R3 are not grounded and their capacitance to the ground can cause problems.

If the lines are made of three-axial tubes the solution of these problems can be resolved as shown at FIG. 2. The stray capacitance of the energy storing lines are converted into impedance of transmission lines and this impedance is taking in account in the calculation. The inductance of the switches is a part of the impedance of the transmission lines and can be compensated by adding a water capacitor. This system produces very fast rise times for the output pulse.

The transportation line can be non-homogeneous and/or can include different dielectrics and delay lines. In one embodiment, the impedance and total delay time of each transportation line is relatively constant. In one embodiment, the dielectric used in at least one of the transportation lines is non-homogenous. In one embodiment, the wall thickness and/or diameter of the inner and/or outer conductors of the transportation lines are non-homogenous. In one embodiment, although one or more aspects of the line are not homogenous, inhomogeneties are arranged to substantially preserve the impedance characteristic. In one embodiment, the energy line due to a relatively small impedance can include of several parallel homogeneous lines or delay lines in parallel.

The line between the outer electrode and the intermediate one serves as transportation line (the impedance is Rt), the line between inner electrode and the intermediate electrode serves as a storing energy line (the impedance is Re). The succession of relative impedance to the first impedance given in Table 3 below provides a theoretical efficiency of 100% of the multi-stage of Blumleins.

TABLE 3

| | N | | | | | | | | | |
|---|---|---|---|---|---|---|---|---|---|---|
| | 1 | 2 | 3 | 4 | 5 | 6 | 7 | 8 | 9 | 10 |
| Rt | 1 | 4 | 8 | 12.8 | 18.3 | 24.4 | 31 | 38.1 | 45.8 | 53.8 |
| Re | 1 | 1.33 | 1.6 | 1.83 | 2.03 | 2.21 | 2.38 | 2.54 | 2.69 | 2.83 |

Although described in terms of specific embodiments, one of ordinary skill in the art will recognize that other embodiments are possible. Thus, the scope of the invention is limited only by the allowed claims.

What is claimed is:

1. An apparatus comprising: a plurality of axial Blumleins each having an outer electrode, an intermediate electrode, and an inner electrode, where the intermediate electrode of a first Blumlein is provided to a ground via a first switch and the inner electrode on the distal end of the first Blumlein is provided via a second switch to the intermediate electrode of a second Blumlein, from inner electrode of the second Blumlein via a third switch to the intermediate electrode of a third Blumlein, where the inner electrode of the third Blumlein is connected to a load, and where said intermediate electrodes are coupled to a power supply via inductors and to the ground via inductors.

2. The apparatus of claim 1, wherein each of said Blumleins is provided to a charging power supply through supply charging inductors and to ground through supply grounding inductors.

3. The apparatus of claim 2, wherein said supply charging inductors and said supply grounding inductors have sufficient inductance to represent a relatively high impedance at the frequencies of the pulses generated by the pulse generator.

4. The apparatus of claim 2, wherein said supply charging inductors and said supply grounding inductors have sufficiently low inductance to allow said Blumleins to be substantially recharged between pulses.

5. An apparatus comprising: a plurality of axial Blumleins each having an outer electrode, an intermediate electrode, and an inner electrode, where the intermediate electrode of a first Blumlein is provided to a ground via a first switch and the inner electrode of the first Blumlein is provided via a second switch to the intermediate electrode of a second Blumlein, where the inner electrode of the second Blumlein is provided to a load.

6. An apparatus comprising: a plurality of Blumleins each having an input electrode and an output electrode, wherein said plurality of Blumleins are connected in series such that an output electrode of each Blumlein is provided through a switch to an input of a subsequent Blumlien, wherein the input electrode of the first Blumlien is provided to ground through a switch, and wherein output of the last Blumlien in the series is provided to a load.

7. The apparatus of claim 6, wherein each of said Blumleins is provided to a charging power supply through inductors and to ground through inductors.

8. The apparatus of claim 6, wherein said apparatus comprises at least one transportation line having a substantially uniform characteristic impedance.

9. The apparatus of claim 8, wherein a dielectric used in said transportation lines is non-homogenous.

10. The apparatus of claim 8, wherein a wall thickness of an inner conductor of said transportation line is non-homogeneous.

11. The apparatus of claim 8, wherein a diameter of an inner conductor of said transportation line is non-homogeneous.

12. The apparatus of claim 8, wherein a wall thickness of an outer conductor of said transportation line is non-homogeneous.

13. The apparatus of claim 8, wherein a diameter of an outer conductor of said transportation line is non-homogeneous.

14. The apparatus of claim 8, wherein a dielectric used in said transportation lines is non-homogenous.

15. The apparatus of claim 8, wherein a wall thickness of an inner conductor of said transportation line is non-homogeneous.

16. The apparatus of claim 8, wherein a diameter of an inner conductor of said transportation line is non-homogeneous.

17. The apparatus of claim 8, wherein a wall thickness of an outer conductor of said transportation line is non-homogeneous.

18. The apparatus of claim 8, wherein a diameter of an out conductor of said transportation line is non-homogeneous.

* * * * *